(12) United States Patent
Lee et al.

(10) Patent No.: US 12,254,915 B1
(45) Date of Patent: Mar. 18, 2025

(54) INTEGRATED CIRCUIT STRUCTURE AND METHOD FOR FORMING AND OPERATING THE SAME

(71) Applicant: MACRONIX INTERNATIONAL CO., LTD., Hsinchu (TW)

(72) Inventors: Dai-Ying Lee, Hsinchu County (TW); Teng-Hao Yeh, Zhubei (TW); Wei-Chen Chen, Taoyuan (TW); Rachit Dobhal, New Taipei (TW); Zefu Zhao, Taipei (TW); Chee-Wee Liu, Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 27 days.

(21) Appl. No.: 18/240,852

(22) Filed: Aug. 31, 2023

(51) Int. Cl.
*G11C 11/22* (2006.01)
*G11C 5/06* (2006.01)
*H10B 51/20* (2023.01)
*H10D 30/01* (2025.01)
*H10D 30/69* (2025.01)

(52) U.S. Cl.
CPC .......... *G11C 11/2275* (2013.01); *G11C 5/063* (2013.01); *G11C 11/2273* (2013.01); *H10B 51/20* (2023.02); *H10D 30/0415* (2025.01); *H10D 30/701* (2025.01)

(58) Field of Classification Search
CPC . G11C 11/2275; G11C 5/063; G11C 11/2273; H01L 29/6684; H01L 29/78391; H10B 51/20
USPC .................................................. 365/145, 158
See application file for complete search history.

(56) References Cited

U.S. PATENT DOCUMENTS

| | | | | |
|---|---|---|---|---|
| 6,049,477 A * | 4/2000 | Taira | ...................... | H10B 53/00 257/295 |
| 10,374,054 B2 * | 8/2019 | Yoo | ........................ | H01L 29/513 |
| 11,145,676 B1 * | 10/2021 | Chiang | ............... | G11C 11/1673 |
| 2004/0051126 A1 * | 3/2004 | Cuchiaro | .............. | H01L 29/516 257/295 |
| 2005/0280065 A1 * | 12/2005 | Iwata | ................ | H01L 29/40117 257/E21.208 |
| 2005/0282296 A1 * | 12/2005 | Hsu | ................... | H01L 29/78391 257/E29.272 |
| 2007/0228432 A1 * | 10/2007 | Ishihara | ............ | H01L 29/40111 257/295 |
| 2015/0053990 A1 * | 2/2015 | Chiang | ............... | H01L 29/7783 438/172 |

(Continued)

FOREIGN PATENT DOCUMENTS

CN             114758695 A      7/2022

*Primary Examiner* — Michael T Tran
(74) *Attorney, Agent, or Firm* — McClure, Qualey & Rodack, LLP

(57) ABSTRACT

The integrated circuit structure includes a substrate and a memory cell over the substrate. The memory cell includes a channel layer, a first doped region, a second doped region, a first ferroelectric layer, and a first gate layer. The first doped region is at a first side of the channel layer and doped with a first dopant being of a first conductivity type. The second doped region is at a second side of the channel layer opposing the first side and doped with a second dopant being of a second conductivity type different from the first conductivity type. The ferroelectric layer is over the channel layer and between the first and second doped regions. The gate layer is over the ferroelectric layer.

19 Claims, 14 Drawing Sheets

(56) References Cited

U.S. PATENT DOCUMENTS

| | | | |
|---|---|---|---|
| 2015/0070964 A1* | 3/2015 | Yamada | H01L 29/78391 |
| | | | 257/295 |
| 2017/0250224 A1* | 8/2017 | Ratnam | H01L 29/1033 |
| 2018/0366488 A1* | 12/2018 | Choi | H10D 30/6892 |
| 2021/0408240 A1 | 12/2021 | Li | |
| 2022/0262805 A1* | 8/2022 | Tomita | H10B 41/35 |
| 2023/0155026 A1* | 5/2023 | Bae | H01L 29/516 |
| | | | 257/295 |

* cited by examiner

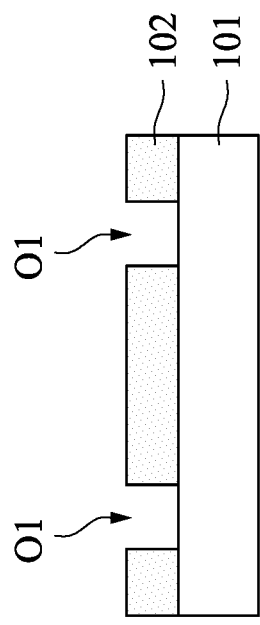
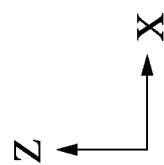
Fig. 6
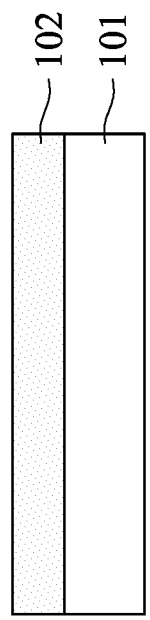
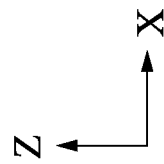
Fig. 5

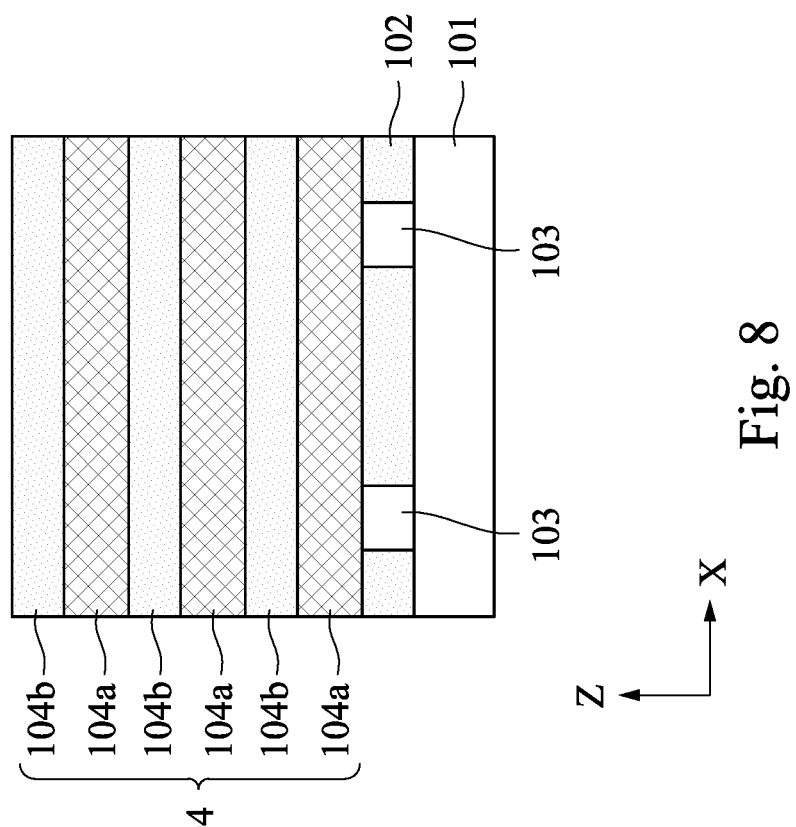
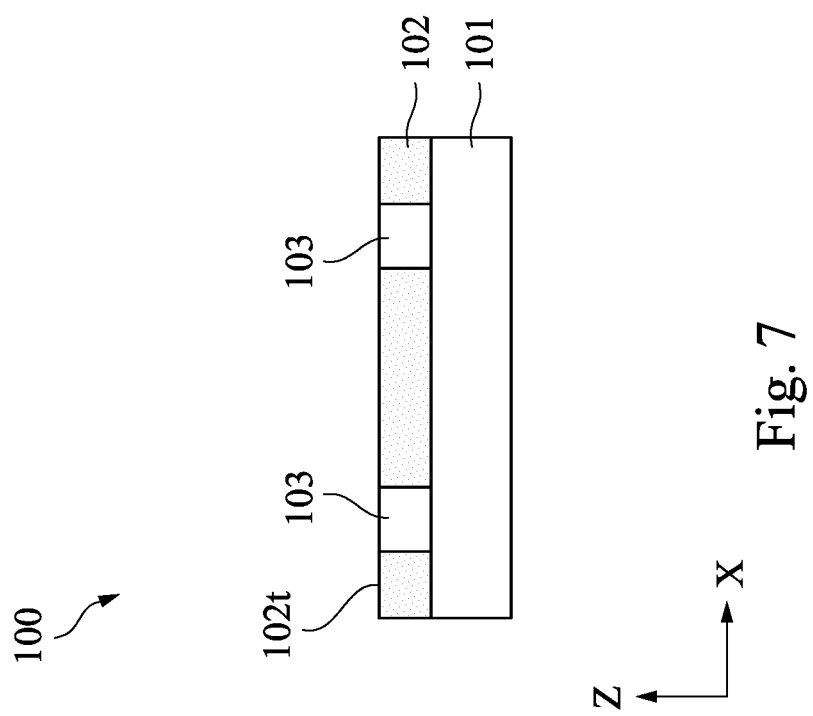

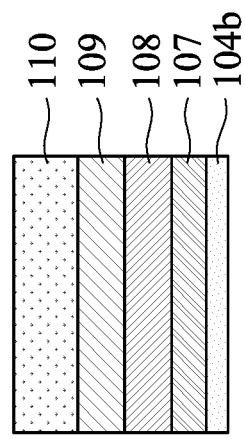
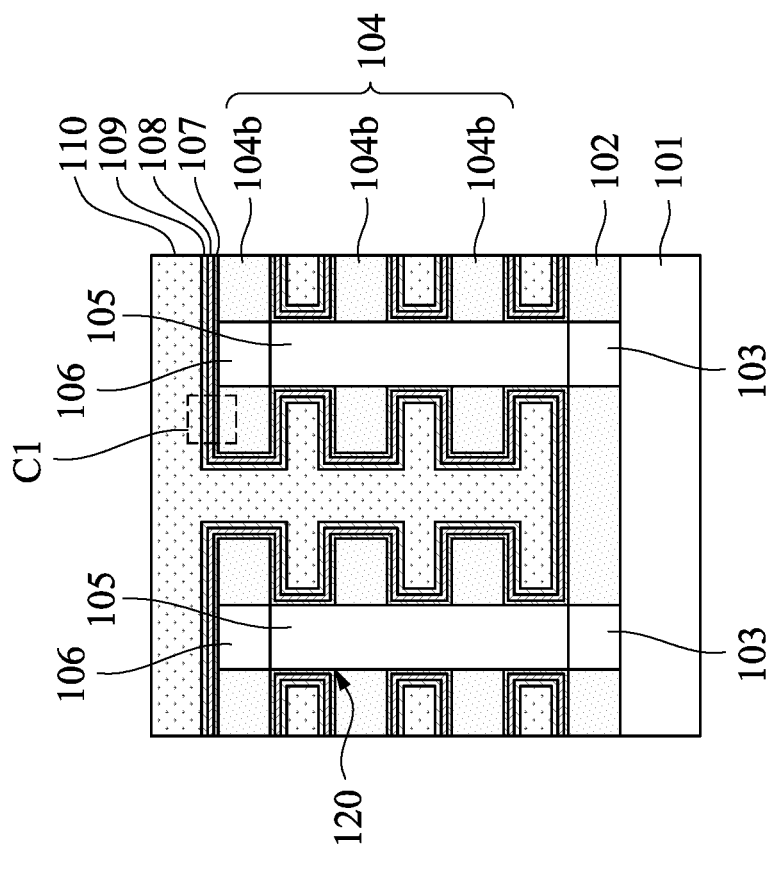
Fig. 14A
Fig. 14B

INTEGRATED CIRCUIT STRUCTURE AND METHOD FOR FORMING AND OPERATING THE SAME

BACKGROUND

Field of Invention

The present invention relates to an integrated circuit structure. More particularly, the present invention relates to a method for forming an integrated circuit structure and a method for operating an integrated circuit structure.

Description of Related Art

The present disclosure generally relates to semiconductor devices, and particularly to methods of making a 3-dimensional (3D) memory device.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

SUMMARY

The invention provides an integrated circuit (IC) structure. The IC structure incudes a substrate and a memory cell over the substrate. The memory cell includes a channel layer, a first doped region, a second doped region, a first ferroelectric layer, and a first gate layer. The first doped region is at a first side of the channel layer and doped with a first dopant being of a first conductivity type. The second doped region is at a second side of the channel layer opposing the first side and doped with a second dopant being of a second conductivity type different from the first conductivity type. The first ferroelectric layer is over the channel layer and between the first and second doped regions. The first gate layer is over the first ferroelectric layer.

In some embodiments, the channel layer has a dopant concentration less than 1E11 cm$^{-3}$.

In some embodiments, the channel layer laterally extends from the first doped region to the second doped region in a direction in parallel with a top surface of the substrate.

In some embodiments, the channel layer vertically extends from the first doped region to the second doped region in a direction perpendicular to a top surface of the substrate.

In some embodiments, the first dopant being of a p-type dopant, and the second dopant being of an n-type dopant.

In some embodiments, the first ferroelectric layer is made of silicon-doped hafnium oxide, aluminum-doped, hafnium zirconium oxide, hafnium oxide, or zirconium oxide, combinations thereof, or combinations thereof.

In some embodiments, the IC structure further includes a word line connected to the gate layer.

In some embodiments, the IC structure further includes a second ferroelectric layer and a second gate layer. The second ferroelectric layer is over the channel layer and spaced apart from the first ferroelectric layer by a non-zero distance. The second gate layer over the second ferroelectric layer.

The invention provides a method for forming an integrated circuit structure. The method includes forming a first doped semiconductive layer over a substrate, the first doped semiconductive layer comprising a first dopant with a first conductivity type; forming a multi-layered stack over the doped semiconductive layer, the first multi-layered stack comprising a plurality of insulating layers stacked in a vertical direction and spaced apart from each other; forming a channel layer vertically extending through the multi-layered stack and on the first doped semiconductive layer; forming a second doped semiconductive layer over the channel layer, the second doped semiconductive layer comprising a second dopant with a second conductivity type different from the first conductivity type; forming a plurality of ferroelectric layers alternately stacked with the insulating layers and over the channel layer; forming a plurality of gate layers over the ferroelectric layers.

In some embodiments, the channel layer is made of un-doped silicon.

In some embodiments, the first dopant is of a p-type dopant, and the second dopant is of an n-type dopant.

In some embodiments, the gate layers comprise tungsten.

In some embodiments, the method further includes prior to forming the ferroelectric layers, forming a plurality of interfacial dielectric layers alternately stacked with the insulating layers and over the channel layer.

In some embodiments, the method further includes prior to forming the gate layers, forming a plurality of barrier layers over the ferroelectric layers.

In some embodiments, the barrier layers comprise titanium nitride.

The invention provides a method for operating an integrated circuit structure. The integrated circuit structure includes a memory array structure that includes a plurality of ferroelectric tunnel field-effect transistors (FeTFETs) configured as individual memory cells in a grid-like structure defined by integrated a plurality of laterally gate layers and a plurality of vertically channel layers. The laterally gate layers are arranged in a vertical direction and each connected to distinct word lines. The vertically channel layers are arranged in a horizontal direction, sequentially connected to bit lines at their topmost ends via first doped regions, and at their bottommost ends to a sensing circuitry via second source/d rain regions. The second doped regions are of a conductivity type different from a conductivity type of the first doped regions. The method includes performing a program operation on the memory array structure; performing an erase operation on the memory array structure; performing a read operation on the memory array structure.

In some embodiments, the program operation includes providing a voltage to one of the word lines to generate an electric field that instigates a shift in a polarization of a ferroelectric layer within one of the FeTFETs; maintaining the other word lines at zero voltage; grounding one of the bit lines; providing the voltage to the other bit lines.

In some embodiments, the erase operation includes providing a voltage to the word lines to facilitate a reversal of polarization in a ferroelectric layer within one of the FeTFETs; grounding the bit lines.

In some embodiments, the read operation includes providing a first voltage to one of the word lines; modulating the first voltage lying between a program threshold voltage and an erase threshold voltage; providing a second voltage to the other word lines, the second voltage enabling a sensing circuitry to detect a memory state; providing a third voltage to one of the bit lines; grounding the other bit lines.

In some embodiments, the third voltage is 0.7V.

BRIEF DESCRIPTION OF THE DRAWINGS

The invention can be more fully understood by reading the following detailed description of the embodiment, with reference made to the accompanying drawings as follows:

FIGS. 5-14A and 15-17 illustrate cross-sectional views of a method in various stages of forming a FeTFET of a memory device in accordance with some embodiments of the present disclosure.

FIG. 14B illustrates a local enlarged view of region C1 in FIG. 14A.

DETAILED DESCRIPTION

Figure 1A:
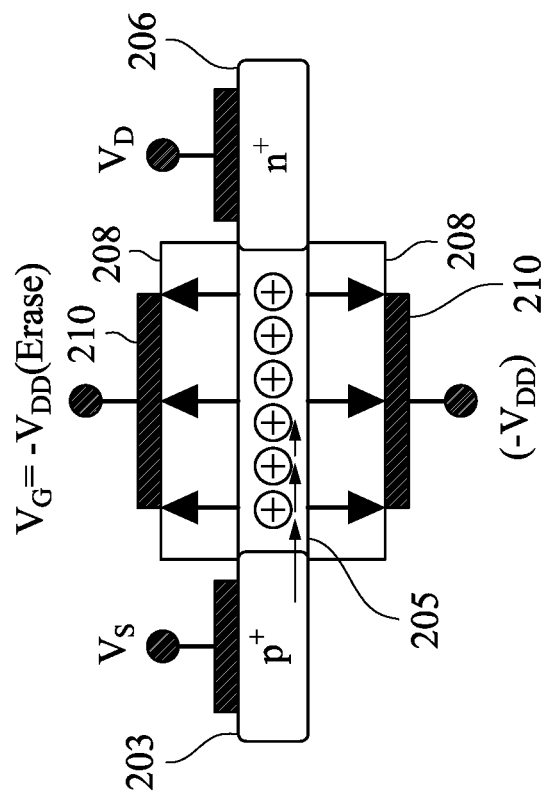
FIGS. 1A and 1B illustrate schematic diagrams of a ferroelectric-tunnel field effect transistor (FeTFET) of a memory device in program and erase operations, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

In conventional n-type ferroelectric field-Effect Transistors (FeFETs), where both source and drain regions are doped with the same conductivity type dopant (e.g., n-type dopant), the programming and erasing operations rely on electrons and positively ionized donors, respectively. This presents a challenge when dealing with n-type FeFETs with a p-body or an un-doped body, as the erasing process becomes notably difficult. The issue arises from the interaction of different charge carriers required for the proper functioning of these devices, thus impacting the performance and reliability of the FeFET on a memory cell array structure.

Therefore, the present disclosure in various embodiments provides a ferroelectric tunneling field-effect transistor (FeTFET). The source and drain regions of the FeTFET are doped with dopants of different conductivities, (i.e., n-type dopant and p-type dopant). This arrangement can offer enhanced control over charge carrier movement, improving the transistor's overall functionality on the memory cell array structure. Additionally, the FeTFET can eliminate of the need for channel doping, and thus the floating body of the FeTFET can be programmed and erased in efficiency, and the manufacturing complexities can be reduced accordingly.

Figure 1B:
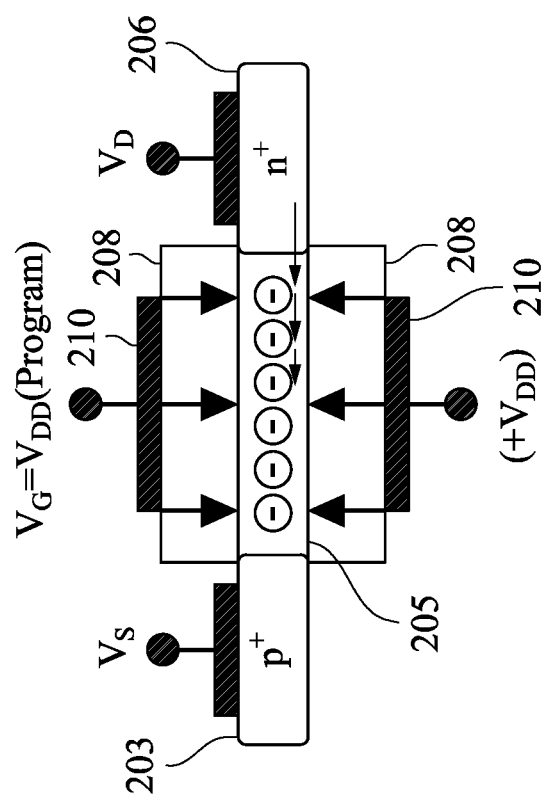
Figure 1C:
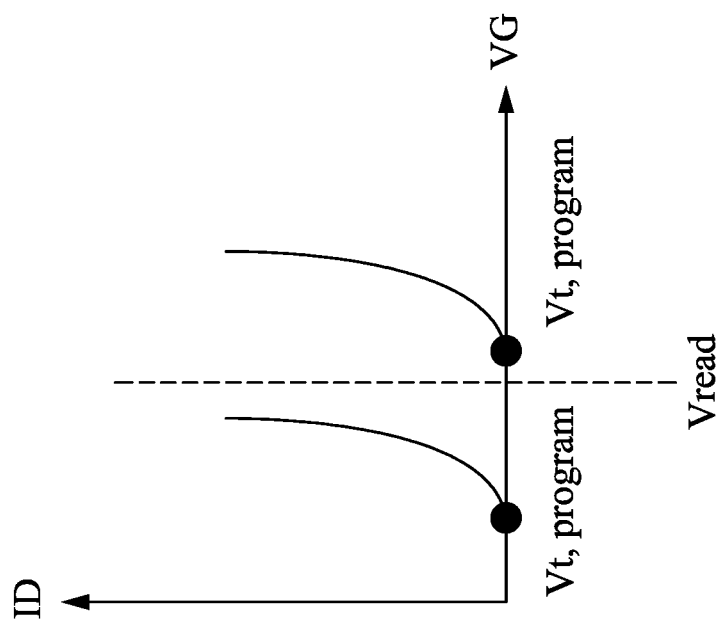
FIG. 1C illustrates a drain current (ID) versus gate voltage characteristic of a FeTFET in accordance with some embodiments of the present disclosure.

Reference is made to FIGS. 1A-1C. FIGS. 1A and 1B illustrate schematic diagrams of a ferroelectric-tunnel field effect transistor (FeTFET) 220 of a memory device in program and erase operations, in accordance with some embodiments of the present disclosure. FIG. 1C illustrates a drain current versus gate voltage characteristic of the FeTFET 220 in accordance with some embodiments of the present disclosure. As shown in FIGS. 1A and 1B, the FeTFET 220 may include source/drain regions 203 and 206, a ferroelectric layer 208, a gate layer 210, and a channel layer 205.

The source/drain regions 203 and 206 are heavily doped with impurities to create either an excess of electrons (e.g., n-type doping) or an excess of holes (e.g., p-type doping). The source/drain regions 203 and 206 act as the origin and termination point for the flow of charge through the channel layer 205. The source/drain region 203 has a different conductivity from the source/drain region 206. In some embodiments, the source/drain region 203 can be a p-type source/drain region, and the source/drain region 206 can be a n-type source/drain region. By way of example and not limitation, the source/drain region 203 can be heavily doped with a p-type dopant (e.g., boron), and the source/drain region 206 can be heavily doped with an n-type dopant (e.g., phosphorus or arsenic). In some embodiments, the source/drain region 203 can be a p-type source/drain region, and the source/drain region 206 can be a n-type source/drain region. By way of example and not limitation, the source/drain region 203 can be heavily doped with an n-type dopant, and the source/drain region 206 can be heavily doped with a p-type dopant. In some embodiments, source/drain regions 203 and 206 can be made of doped semiconductor material, such as silicon (Si), germanium (Ge), III-V compound semiconductor (e.g., indium gallium arsenide (InGaAs), combinations thereof, or other suitable materials. Therefore, the source/drain region 203 can be interchangeably referred to as a first doped region, and the source/drain region 206 can be interchangeably referred to as a second doped region. In some embodiments, the source/drain region 203 is a source region, and the source/drain region 206 is a drain region.

The ferroelectric layer 208 can be made of a ferroelectric material, such as silicon-doped hafnium oxide ($HfO_2$), aluminum-doped ($HfO_2$), hafnium zirconium oxide ($HfZrO_x$), hafnium oxide ($HfO_2$), or zirconium oxide ($ZrO_2$), combinations thereof, or other suitable materials. This material can exhibit a spontaneous electric polarization that can be reversed by the application of an external electric field and enable a non-volatile memory capabilities to the FeTFET 220.

The gate layer 210 can control terminal of the FeTFET 220, applying an electric field to the ferroelectric layer 208, thereby controlling the polarization state of the ferroelectric material and, consequently, the conductivity of the channel layer 205. In some embodiments, the gate layer 210 may be made of tungsten (W), cobalt (Co), ruthenium (Ru), molybdenum (Mo), aluminum (Al), copper (Cu), combinations thereof, or other suitable materials.

The channel layer 205 can connect the source/drain region 203 to the source/drain region 206. The channel layer 205 in the FeTFET 220 can a thin layer of semiconductor material through which current flows when the FeTFET 220 is in the "on" state. As shown in FIGS. 1A and 1B, the channel layer 205 can be formed over a substrate (not shown) and laterally extend in parallel with a top surface of the substrate. In the FeTFET 220, the channel layer 205 can be lightly or not doped. This allows the state of the ferroelectric layer 208 (i.e., its polarization) to control the flow of charge carriers (electrons or holes) through the channel layer 205, thereby switching the FeTFET 220 "on" or "off". In some embodiments, the channel layer 205 can be made of a semiconductor material, such as silicon (Si), germanium (Ge), III-V compound semiconductor (e.g., indium gallium arsenide (InGaAs), combinations thereof, or other suitable materials. In some embodiments, the channel layer 205 has a dopant concentration less than 1E11 $cm^{-3}$. In some embodiments, the dopant concentration of the channel layer 205 is less than a dopant concentration of the source/drain regions 203, and less than a dopant concentration of the source/drain regions 206. In some embodiments, the channel layer 205 can be dopant-free.

As shown in FIGS. 1A-1C, the FeTFET 220 can use the ferroelectric layer 208 to control the state of the transistor, rather than relying on doped channels. This simplifies the manufacturing process and improves device reliability by reducing variability. Moreover, the programming and erasing of the device state in the FeTFET 220 can be achieved more efficiently. During the program and erase operations, the voltages $V_S$ and $V_D$ connected to the source/drain regions 203 and 206 are the same, meaning that no bias is applied to these regions. This configuration aids in simplifying the control scheme and reduces power consumption during these operations.

Specifically, during the program operation (see FIGS. 1A and 1C), electrons are injected from the $n^+$ side (e.g., one of the source/drain regions 203 and 206) into the channel layer 205, facilitated by a power voltage ($V_{program}=+V_{DD}$) applied at the gate layer 210. With the voltages (electric potentials) $V_S$ and $V_D$ connected to the source/drain regions 203 and 206 are the same (e.g., the voltages $V_S$ and $V_D$ substantially are 0V), the gate voltage alone controls this electron injection, enabling the transition of the FeTFET 220 to a specific memory state. In some embodiments, during the program operation, floating or grounding can be applied on the source/drain regions 203 and 206 to make the electric potentials on the source/drain regions 203 and 206 the same, but the present disclosure is not limited thereto. During the erase operation (see FIGS. 1B and 1C), holes are injected from the $p^+$ side (e.g., another one of the source/drain regions 203 and 206) into the channel layer 205, facilitated by a negative power voltage ($V_{erase}=-V_{DD}$) applied at the gate layer 210. With the voltages (electric potentials) $V_S$ and $V_D$ connected to the source/drain regions 203 and 206 are the same (e.g., the voltages $V_S$ and $V_D$ substantially are 0V), the gate voltage alone controls this hole injection, enabling the transition of the FeTFET 220 to another specific memory state. In some embodiments, during the erase operation, floating or grounding can be applied on the source/drain regions 203 and 206 to make the electric potentials on the source/drain regions 203 and 206 the same, but the present disclosure is not limited thereto. The read operation (see FIG. 1C), on the other hand, involves an electron injection from the $n^+$ side with a gate voltage (Vread) between the threshold voltages of the program and erase operations (Vt, program<Vread<Vt, erase), and the voltage $V_D$ on the source/drain region 206 will be greater than or slightly greater than the voltage $V_S$ on the source/drain region 203. This method can allow for efficient and robust switching among different memory states for the FeTFET 220, and the polarization state of the FeTFET 220 can be non-volatile. That is, it is preserved even when power is removed from the FeTFET 220.

Figure 2B:
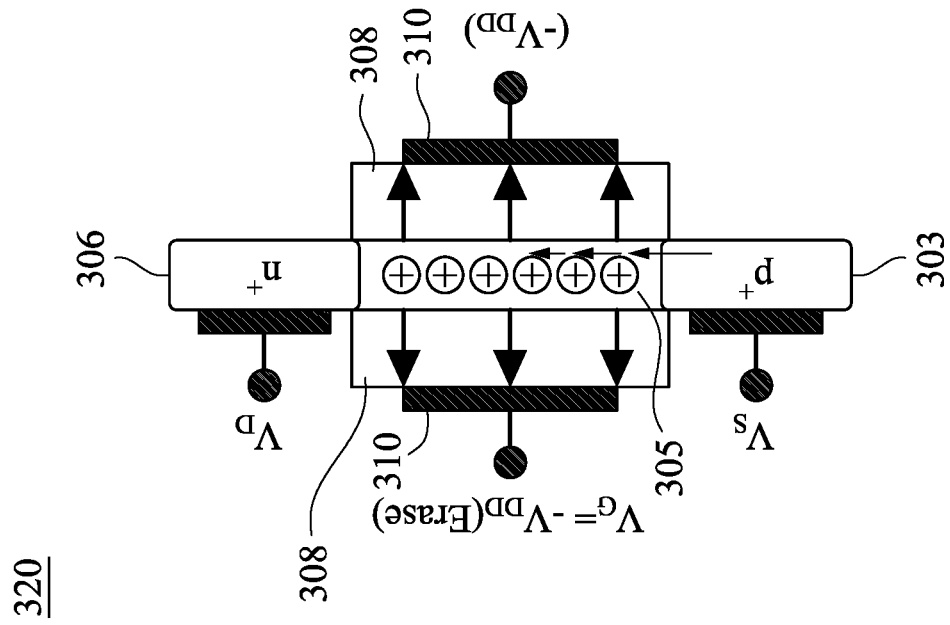
FIGS. 2A-3B illustrate schematic diagrams of FeTFETs of memory devices in accordance with some embodiments of the present disclosure.
Figure 2A:
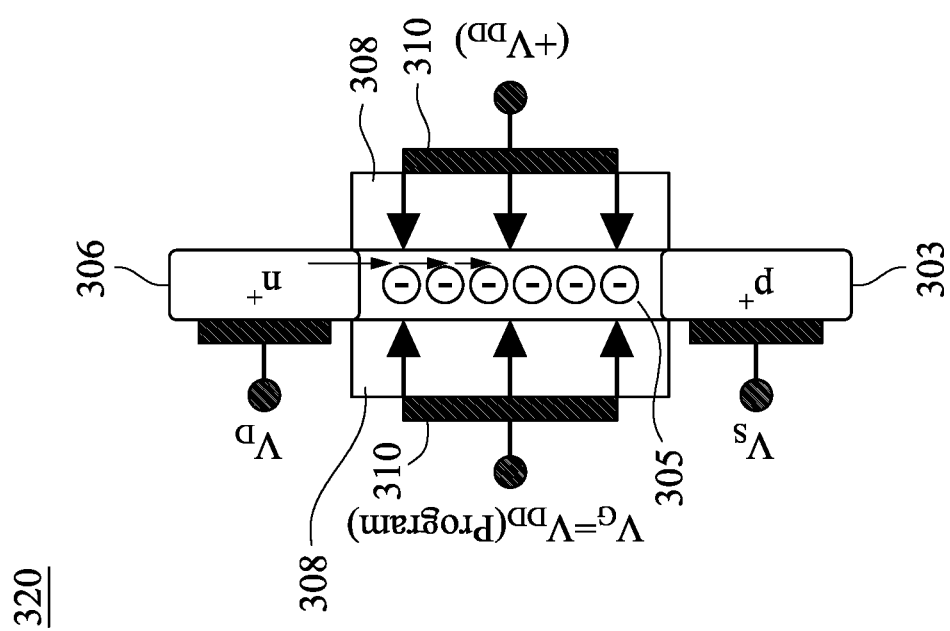

Reference is made to FIGS. 2A and 2B. FIGS. 2A and 2B illustrate schematic diagrams of a FeTFET 320 of a memory device in program and erase operations, in accordance with some embodiments of the present disclosure. The description provided refers to another embodiment of a memory device, specifically featuring a different arrangement compared to the embodiment showcased in FIGS. 1A and 1B. In this variant shown in FIGS. 2A and 2B, source/drain regions 303 and 306, a ferroelectric layer 308, a gate layer 310, and a channel layer 305 are fundamentally similar to those in FIGS. 1A and 1B in terms of their material and manufacturing methods. That means the source/drain regions 303 and 306 can correspond to the source/drain regions 203 and 206, the ferroelectric layer 308 can correspond to the ferroelectric layer 208, the gate layer 310 can correspond to the gate layer 210, and the channel layer 305 can correspond to the channel layer 205 in the previous figures. In some embodiments, the source/drain region 303 is a source region, and the source/drain region 306 is a drain region. In some embodiments, the source/drain region 303 can be interchangeably referred to as a first doped region, and the source/drain region 306 can be interchangeably referred to as a second doped region.

The distinct difference in this embodiment lies in the arrangement of the FeTFET 320. Unlike the laterally extending channel layer 205 over the substrate (not shown) in FIGS. 2A and 2B, the embodiment in FIGS. 2A and 2B incorporates the channel layer 205 extending in a direction perpendicular to a top surface of the substrate (not shown), such that the gate layer 310 can laterally surround the channel layer 305, and the source/drain regions 303 and 306 are located at opposite vertical ends of the channel layer 305, respectively. This vertical setup can be a more space-efficient design. Instead of spreading components out in a two-dimensional plane, this vertical setup effectively utilizes the third dimension (vertical) for component placement. Therefore, for a given area on the substrate, more FeTFETs 320 can be packed, leading to higher memory density, and thus, a smaller overall footprint for a given memory capacity.

The FeTFET 320 can use the ferroelectric layer 308 to control the state of the transistor, rather than relying on doped channels. This simplifies the manufacturing process and improves device reliability by reducing variability. Moreover, the programming and erasing of the device state in the FeTFET 320 can be achieved more efficiently. Specifically, during the program operation (see FIG. 2A), electrons are injected from the $n^+$ side (one of the source/drain regions 303 and 306) into the channel layer 305, facilitated by a power voltage ($V_{program}=+V_{DD}$) applied at the gate layer 310. With the voltages (electric potentials) $V_S$ and $V_D$ connected to the source/drain regions 303 and 306 are the same (e.g., the voltages $V_S$ and $V_D$ substantially are 0V), the gate voltage alone controls this electron injection, enabling the transition of the FeTFET 320 to a specific memory state. In some embodiments, during the program operation, floating or grounding can be applied on the source/drain regions 303 and 306 to make the electric potentials on the source/drain regions 303 and 306 the same, but the present disclosure is not limited thereto. During the erase operation (see FIG. 2B), holes are injected from the p⁺ side (e.g., another one of the source/drain regions 303 and 306) into the channel layer 305, facilitated by a negative power voltage ($V_{erase}=-V_{DD}$) applied at the gate layer 310. With the voltages (electric potentials) $V_S$ and $V_D$ connected to the source/drain regions 303 and 306 are the same (e.g., the voltages $V_S$ and $V_D$ substantially are 0V), the gate voltage alone controls this hole injection, enabling the transition of the FeTFET 320 to another specific memory state. In some embodiments, during the erase operation, floating or grounding can be applied on the source/drain regions 303 and 306 to make the electric potentials on the source/drain regions 303 and 306 the same, but the present disclosure is not limited thereto. The read operation, on the other hand, involves an electron injection from the n⁺ side with a gate voltage between the threshold voltages of the program and erase operations ($V_{t,program} < V_{read} < V_{t,erase}$), and the voltage $V_D$ on the source/drain region 306 will be greater than or slightly greater than the voltage $V_S$ on the source/drain region 303. This method can allow for efficient and robust switching among different memory states for the FeTFET 320, and the polarization state of the FeTFET 320 can be non-volatile. That is, it is preserved even when power is removed from the FeTFET 320.

Figure 3B:
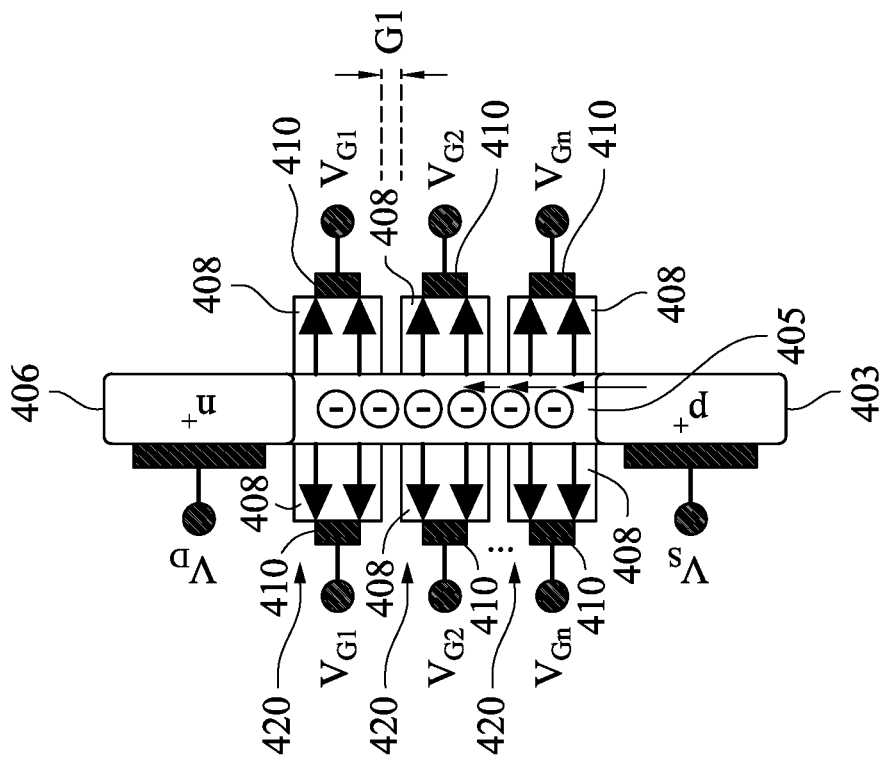
Figure 3A:
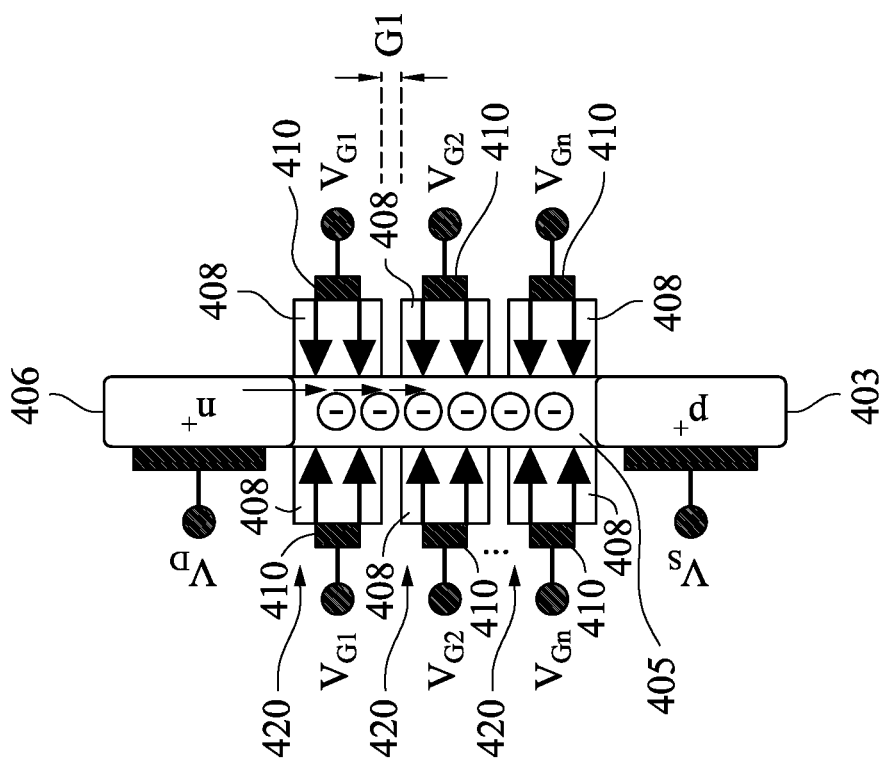

Reference is made to FIGS. 3A and 3B. FIGS. 3A and 3B illustrate schematic diagrams of FeTFETs 420 of a memory device in program and erase operations, in accordance with some embodiments of the present disclosure. The description provided refers to another embodiment of a memory device, specifically featuring a different gate layer configuration and a different ferroelectric layer configuration compared to the embodiment showcased in FIGS. 2A and 2B. In this variant shown in FIGS. 3A and 3B, source/drain regions 403 and 406, a plurality of ferroelectric layers 408, a plurality of gate layers 410, and a channel layer 405 are fundamentally similar to those in FIGS. 2A and 2B in terms of their material and manufacturing methods. That means the source/drain regions 403 and 406 can correspond to the source/drain regions 303 and 306, the ferroelectric layer 408 can correspond to the ferroelectric layer 308, the gate layers 410 can correspond to the gate layer 310, and the channel layer 405 can correspond to the channel layer 305 in the previous figures. In some embodiments, the source/drain region 403 is a source region, and the source/drain region 406 is a drain region. In some embodiments, the source/drain region 403 can be interchangeably referred to as a first doped region, and the source/drain region 406 can be interchangeably referred to as a second doped region.

The distinct difference in this embodiment lies in the gate layer configuration and the ferroelectric layer configuration. Unlike the single gate layer 310 and the single ferroelectric layer 308 in FIGS. 2A and 2B, the embodiment in FIGS. 3A and 3B incorporates multiple gate layers 410 and multiple ferroelectric layers 408. These gate layers 410 and ferroelectric layers 408 are formed to laterally surround the channel layer 405, with a non-zero distance G1 separating them. In some embodiments, the distance G1 can be in a range from 5-10 nm. The implementation of multiple gate layers 410 and multiple ferroelectric layers 408 in this embodiment could allow for more precise and variable control of the channel current by applying voltage $V_{G1}$, $V_{G2}$, ... $V_{Gn}$ to the gate layers 310.

Figures 4A, 4B:
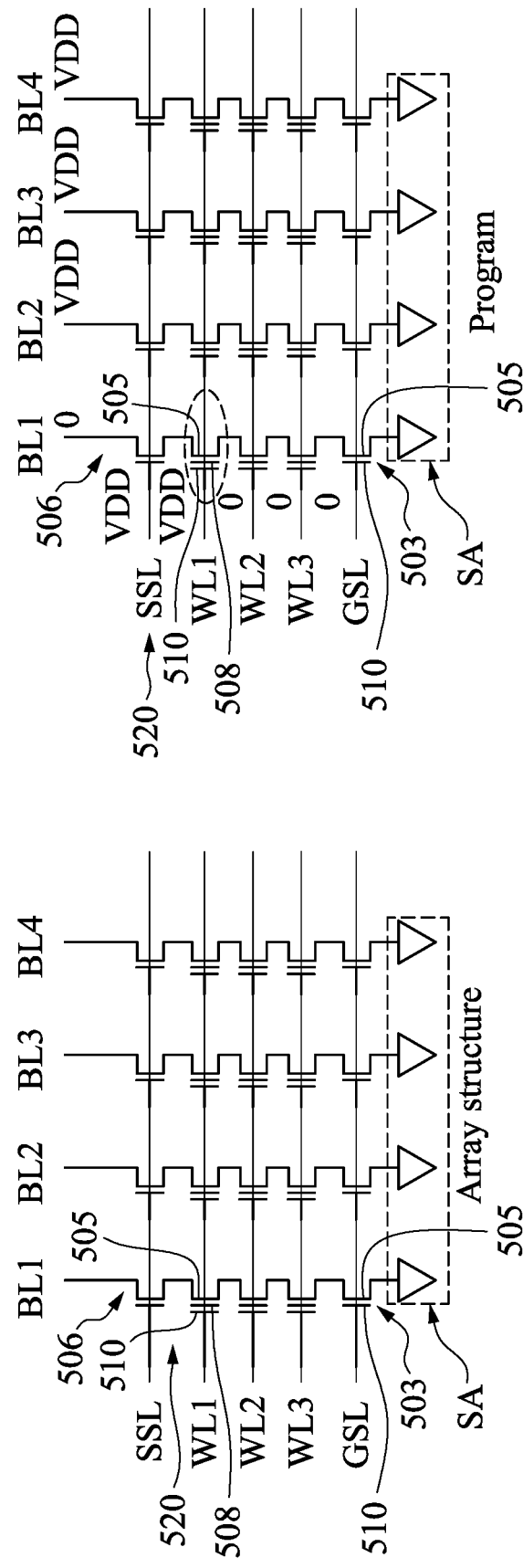
FIG. 4A illustrate an memory cell array structure including FeTFETs of a memory device in accordance with some embodiments of the present disclosure.
FIGS. 4B-4D illustrate equivalent circuit diagrams of a method for operating the memory device in FIG. 4A.
Figure 4D:
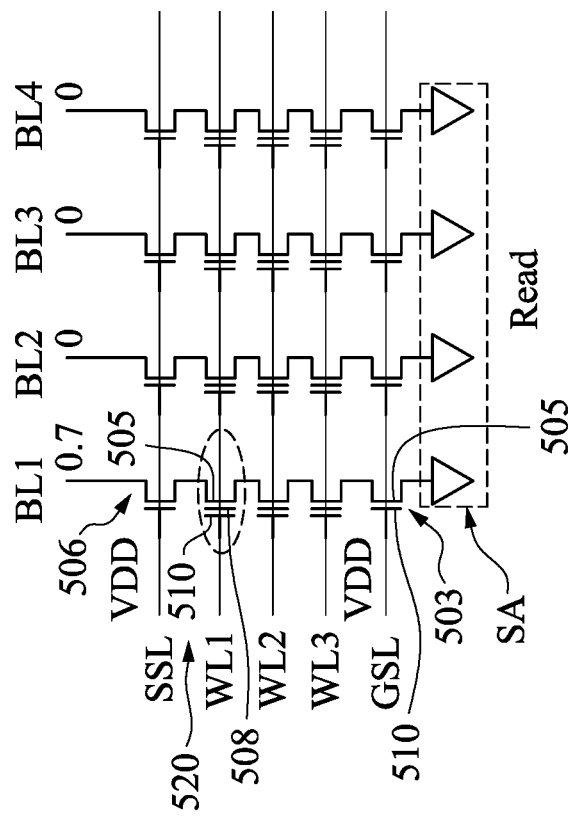
Figure 4C:
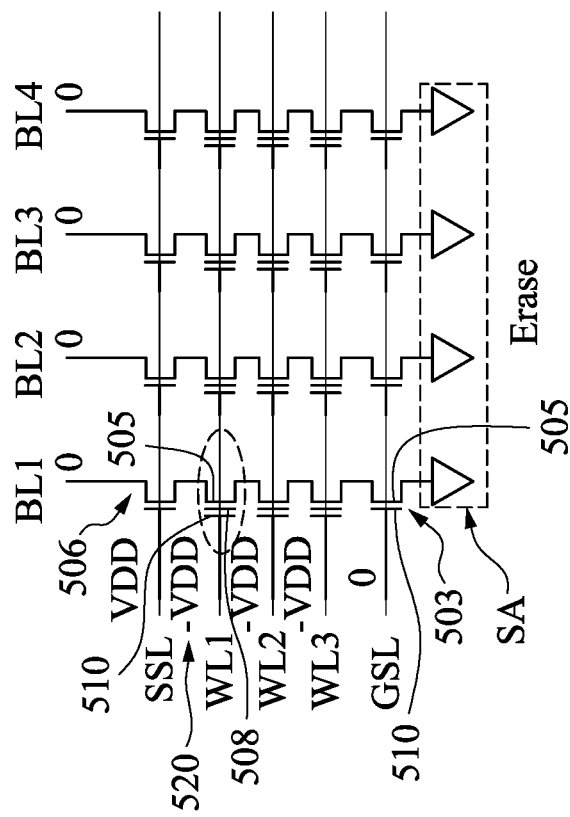

Reference is made to FIGS. 4A-4D. FIG. 4A illustrate a memory cell array structure 500 including FeTFETs 520 of a memory device in accordance with some embodiments of the present disclosure. FIGS. 4B-4D illustrate equivalent circuit diagrams of a method for operating the memory device in FIG. 4A, including a program operation, an erase operation, and a read operation, respectively. In this variant shown in FIGS. 4A-4D, various components of FeTFETs 520 are fundamentally similar to those in FIGS. 3A and 3B in terms of their material and manufacturing methods. That means the FeTFETs 520 can correspond to the FeTFETs 420 in the previous figures.

As shown in FIG. 4A, five gate layers 510 extend in parallel to each other in a vertical direction, and the gate layers 510 integrated with four channel layers 505 which vertically extend in a sequential order along a horizontal direction. Other embodiments may contain more or fewer gate layers and corresponding more or fewer number of channel layers. The integration of the gate layers 510 and channel layers 505 forms a grid-like structure that defines the individual cells of the memory cell array structure 500. The bottommost gate layer 510 can be connect to the ground select line GSL, acting as the grounding reference for the memory cell array structure 500. The topmost gate layer 510 can be connected to the string select line SSL, providing an interface for selecting specific strings of memory cells for operation. The three gate layers 510 in the middle can be linked to word lines WL1, WL2, and WL3, each of which can be controlled separately. These word lines WL1, WL2, and WL3 can interface with the gate layers 510 and control the access to the individual memory cells. The ferroelectric layers 508 are respectively formed to sandwich between the three gate layers 510 in the middle and the channel layers 505. In some embodiments, the three gate layers 510 in the middle can be interchangeably referred to as word line conductors, and the bottommost gate layer 510 connected to the ground select line GSL can be interchangeably referred to as a select gate conductor.

The vertically extending channel layers 505 can form a link between the memory cell array structure 500 and the outside circuitry. The topmost ends of the channel layers 505 are sequentially connected to bit lines BL1, BL2, BL3, and BL4 via the source/drain regions 503. These bit lines BL1, BL2, BL3, and BL4 allow for data transfer to and from the memory cells. The bottommost ends of the channel layers 505 can be sequentially connected to a sensing circuitry SA through the source/drain regions 506. The sensing circuitry SA can be in reading the state of the memory cells by detecting the changes in current passing through the source line SSL. This memory cell array structure 500 including FeTFETs 520 can provide distinct pathways for data input and output, allowing for precise control over individual memory cells, indicating a promising direction for memory device development. In some embodiments, the source/drain region 503 is a source region, and the source/drain region 506 is a drain region. In some embodiments, the source/drain region 503 can be interchangeably referred to as a first doped region, and the source/drain region 506 can be interchangeably referred to as a second doped region.

As shown in FIG. 4B, during the program operation, the topmost word line WL1 is charged to a power voltage, $V_{DD}$.

In other words, the power voltage, $V_{DD}$, is provided to the topmost word line WL1. This biasing provides an electric field to instigate a shift in the polarization of the ferroelectric material within the FeTFET 520, effectively programming the chosen memory cell. Meanwhile, other word lines WL2 and WL3 are maintained at zero voltage to prevent undesired programming of unselected cells. The bit line BL1 is at grounded (e.g., substantially being 0 V), while the other bit lines BL2, BL3, and BL4 are charged to the power voltage, $V_{DD}$, isolating the selected memory cell within the bit-line architecture, preventing interference with adjacent cells. The string select line SSL is charged to the power voltage, $V_{DD}$, creating an active pathway to the selected string of memory cells, and the ground select line GSL is grounded, providing a stable electrical reference. In other words, the power voltage, $V_{DD}$, is provided to the other bit lines BL2, BL3, and BL4 and the string select line SSL.

As shown in FIG. 4C, during the erase operation, all word lines WL1, WL2, and WL3 are charged to negative power voltages, $-V_{DD}$, which facilitates the reversal of polarization in the ferroelectric layer, effectively erasing the stored data. All bit lines BL1, BL2, BL3, and BL4 are grounded (e.g., substantially being 0V), ensuring isolation of the active memory cell. The string select line SSL is charged to the power voltage, $V_{DD}$, creating an active pathway to the selected string of memory cells, and the ground select line GSL is grounded, providing a stable electrical reference. In other words, the voltage, $-V_{DD}$, is provided to the all word lines WL1, WL2, and WL3, and the power voltage, $V_{DD}$, is provided to the string select line SSL.

As shown in FIG. 4D, during the read operation, the voltage applied to word line WL1 is modulated to a value lying between the program threshold voltage $V_{t,program}$ and the erase threshold voltage $V_{t,erase}$, facilitating the reading of the selected memory cell's state without causing a program or erase operation. The other word lines WL2 and WL3 are biased to a voltage value between the erase threshold voltage $V_{t,erase}$ and the power voltage $V_{DD}$. The bit line BL1 is charged to a voltage, such as 0.7 V, enabling the sensing circuitry SA to detect the memory state. Meanwhile, the other bit lines BL2, BL3, and BL4 are grounded. Both string select line SSL and ground select line GSL are charged to power voltages, $V_{DD}$, establishing the necessary electrical conditions for the read operation. In other words, a voltage, such as 0.7 V is provided to the bit line BL1, and the power voltage, $V_{DD}$, is provided to the string select line SSL and the ground select line GSL. Thus, through this voltage control mechanism across different layers of FeTFETs 520, the memory cell array structure 500 achieves accurate control over the different memory operations.

Reference is made to FIGS. 5-17. FIGS. 5-14A and 15-17 illustrate cross-sectional views of a method in various stages of forming a memory cell array structure 100 including FeTFETs 120 (see FIG. 14A) of a memory device in accordance with some embodiments of the present disclosure. FIG. 14B illustrates a local enlarged view of region C1 in FIG. 14A. As shown in FIG. 5, a dielectric layer 102 is formed over a substrate 101. The substrate 101 can be a semiconductor substrate, such as a monocrystalline silicon bulk semiconductor, a semiconductor-on-insulator (SOI) substrate, or the like, which may be doped (e.g., with a p-type or an n-type impurity) or undoped. The SOI substrate can a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the substrate 101 may be a carrier wafer, such as a lower cost wafer or a reclaim wafer. The substrate 101 may have a round top-view shape or a rectangular top-view shape. In some embodiments, the substrate 101 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; the like; or combinations thereof.

In some embodiments, the dielectric layer 102 may be made of dielectric material, such as silicon oxide, silicon nitride (SiN), silicon oxynitride (SiON), silicate, combinations thereof, or other suitable materials. In some embodiments, the dielectric layer 102 can be formed by a chemical vapor deposition (CVD) process.

Reference is made to FIG. 6. A plurality of openings O1 are formed to pass through the dielectric layer 102 to expose portions of the substrate 101. In some embodiments, the openings O1 are formed to extend downwardly through the dielectric layer 102 and terminate prior to reaching the substrate 101.

Figure 10:
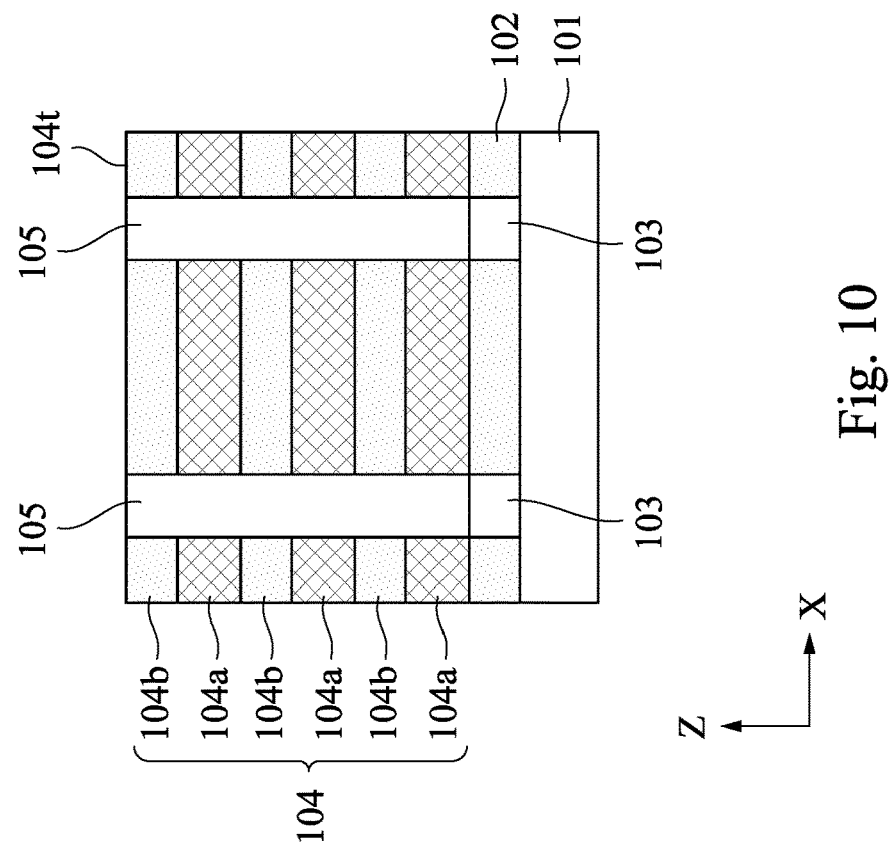

Reference is made to FIG. 7. Subsequently, a doped semiconductive layer 103 is formed in the opening O1 and on the substrate 101 to form an electrical contact with the channel layer 105 as shown in FIG. 10. In some embodiments, the doped semiconductive layer 103 are formed by depositing a poly-silicon (Si), Ge, normally, p-type dopants ($p^+$), such as boron over the multi-layered stack 104. In some embodiment, the doped semiconductive layer 103 can be formed by selective epitaxial growth of silicon, for example seeded by silicon over the substrate 101. Subsequently, a planarization process is performed to remove the excessive semiconductor material above a top surface 102t of the dielectric layer 102. As a result of this method, the doped semiconductive layer 103 can be formed as shown in FIG. 6. In some embodiments, the doped semiconductive layer 103 can be a $p^+$ poly-silicon layer. In some embodiments, the doped semiconductive layer 103 can be interchangeably referred to a source/drain region of a corresponding FeTFET 120 as shown in FIG. 14A.

Reference is made to FIG. 8. A multi-layered stack 104 is formed over the dielectric layer 102. The multi-layered stack 104 may include a plurality of sacrificial layers 104a and a plurality of insulating layers 104b in parallel to each other and alternatively stacked on the substrate 101 along Z-direction. Other embodiments may contain more or fewer number of sacrificial layers 104a and corresponding more or fewer number of insulating layers 104b. In some embodiments, the multi-layered stack 104 can be interchangeably referred to a film stack or a deck of ON pairs. However, it should be appreciated that, in the embodiments of the present disclosure, the sacrificial layers 104a and the insulating layers 104 are made of different material. For example, the sacrificial layers 104a may be made of silicon nitride, and the insulating layers 104b may be made of silicon oxide. In some embodiments, a topmost layer of the insulating layers 116a can be interchangeably referred to a hard mask oxide layer. In some embodiments, the sacrificial layers 104a and the insulating layers 104b can be formed by low pressure chemical vapor deposition (LPCVD) process.

Figure 9:
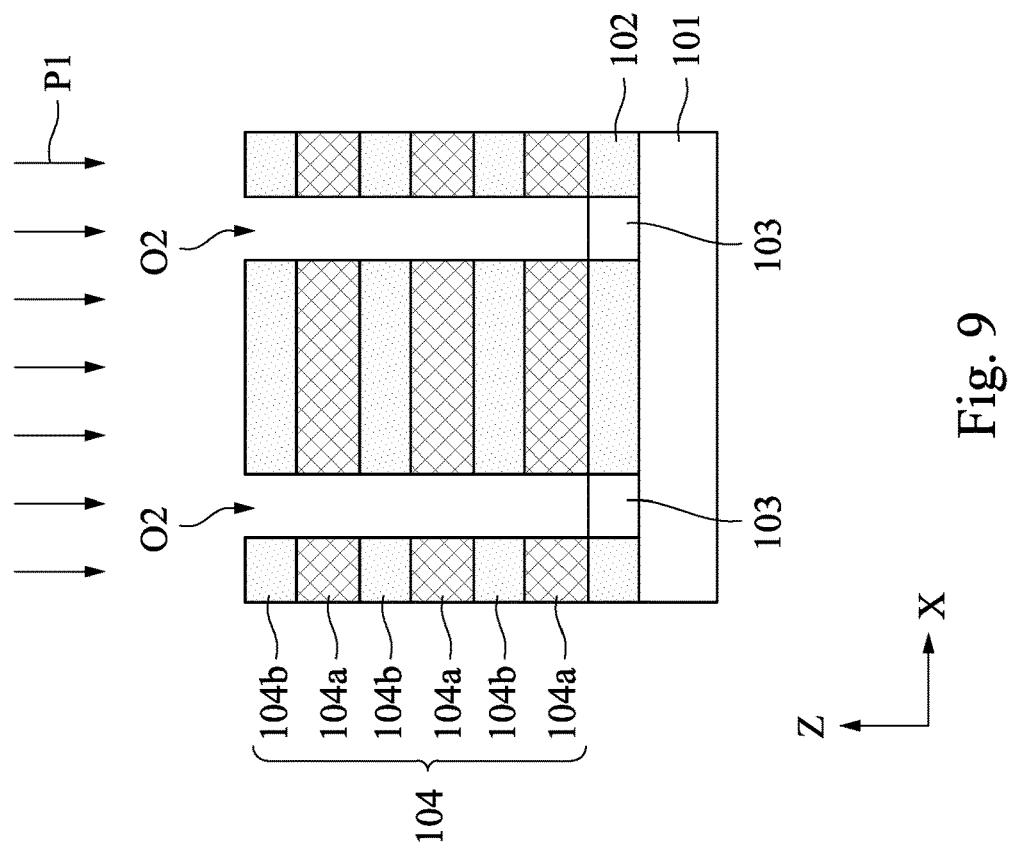

Reference is made to FIG. 9. An etching process P1, such as a hole etch process, is performed on the multi-layered stack 104 to form a plurality of through openings O2 passing through the multi-layered stack 104 and exposing the doped semiconductive layer 103. In some embodiments, the etching process P1 can be an anisotropic etching process, such as a reactive ion etching (RIE) process, performed on the multi-layered stack 104 using a patterned hard mask layer (not shown) as an etching mask formed on the multi-layered stack 104. In some embodiments, the through openings O2 may be a plurality of circular through holes passing through the multi-layered stack 104 along Z-direction and terminate at the doped semiconductive layer 103. The through opening O2 expose portion of the sacrificial layers 104a and the insulating layers 104b serving as sidewalls thereof. In some embodiments, the through opening O2 can be interchangeably referred to as a vertical channel opening.

Reference is made to FIG. 10. A channel layer 105 is formed in the through opening O2. In some embodiments, the channel layer 105 may be made of semiconductive material, such as such as poly-silicon (Si), Ge or other doped/undoped semiconductor material. For example, the channel layer 105 may be made of doped poly-silicon. In some embodiment, the channel layer 105 can be formed by selective epitaxial growth of silicon, for example seeded by silicon over the multi-layered stack 104. Subsequently, a planarization process is performed to remove the excessive semiconductor material above a top surface 104t of the multi-layered stack 104. As a result of this method, the channel layer 105 can be formed as shown in FIG. 10, and thus the IC structure can include a vertical channel memory structure.

Figure 11:
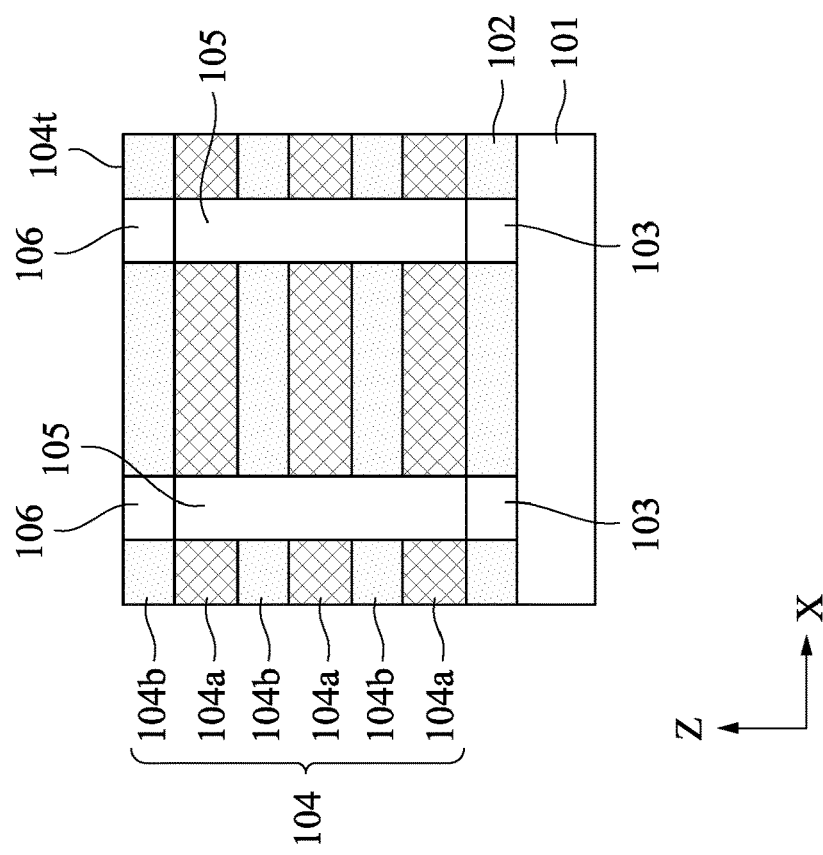

Reference is made to FIG. 11. A doped semiconductive layer 106 is formed in the upper portion of the through opening O2 and on the etched back channel layer 105 to form an electrical contact with the channel layer 105. In some embodiments, the doped semiconductive layer 106 are formed by depositing a poly-silicon (Si), Ge, normally, n-type dopants ($N^+$), such as phosphorus or arsenic over the multi-layered stack 104. Subsequently, a planarization process is performed to remove the excessive semiconductor material above the top surface 104t of the multi-layered stack 104. As a result of this method, the doped semiconductive layer 106 can be formed as shown in FIG. 11. In some embodiments, the doped semiconductive layer 106 can be an $n^+$ poly-silicon layer. In some embodiments, the doped semiconductive layer 106 can be interchangeably referred to a source/drain region of a corresponding FeTFET 120 as shown in FIG. 14A.

Figure 12:
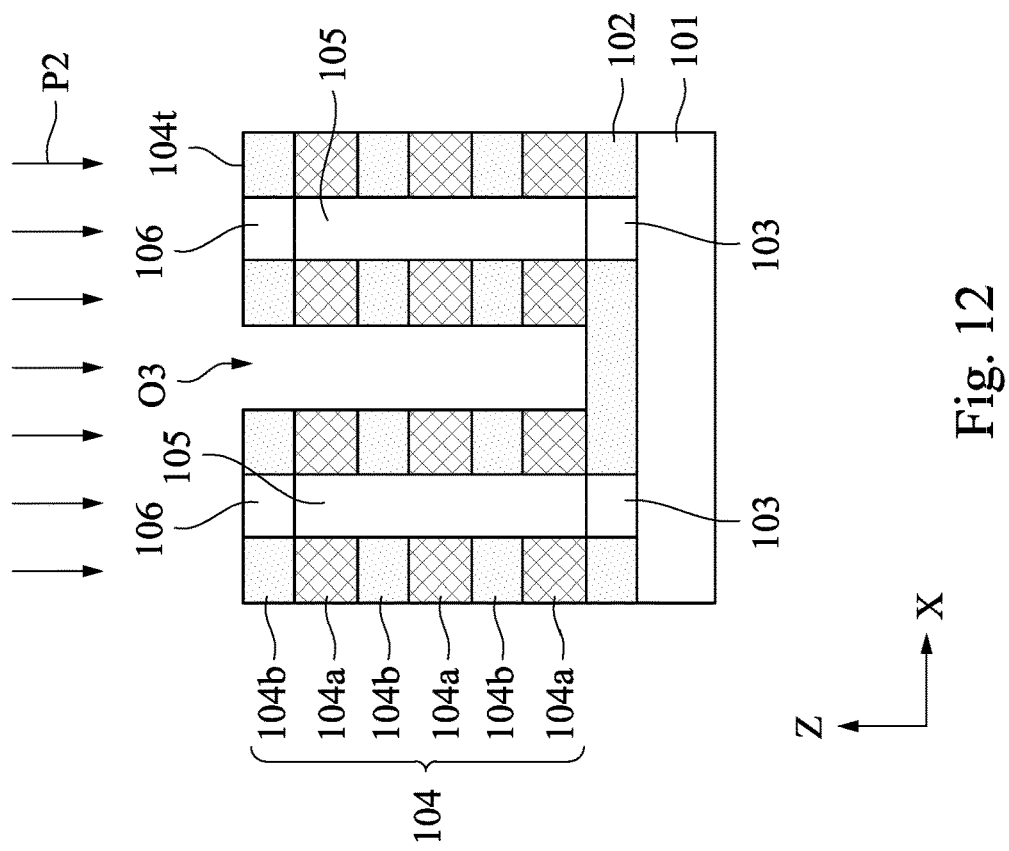

Reference is made to FIG. 12. An etching process P2 is performed to form a through opening O3 passing through the multi-layered stack 104 along the Z-direction and terminating at the top surface 102t of the dielectric layer 102, so as to partially expose the sacrificial layers 104a and the insulating layers 104b. In some embodiments, the etching process P3 can be an anisotropic etching process, such as a reactive ion etching (RIE) process, performed on the multi-layered stack 104 using a patterned hard mask layer (not shown) as an etching mask.

Figure 13:
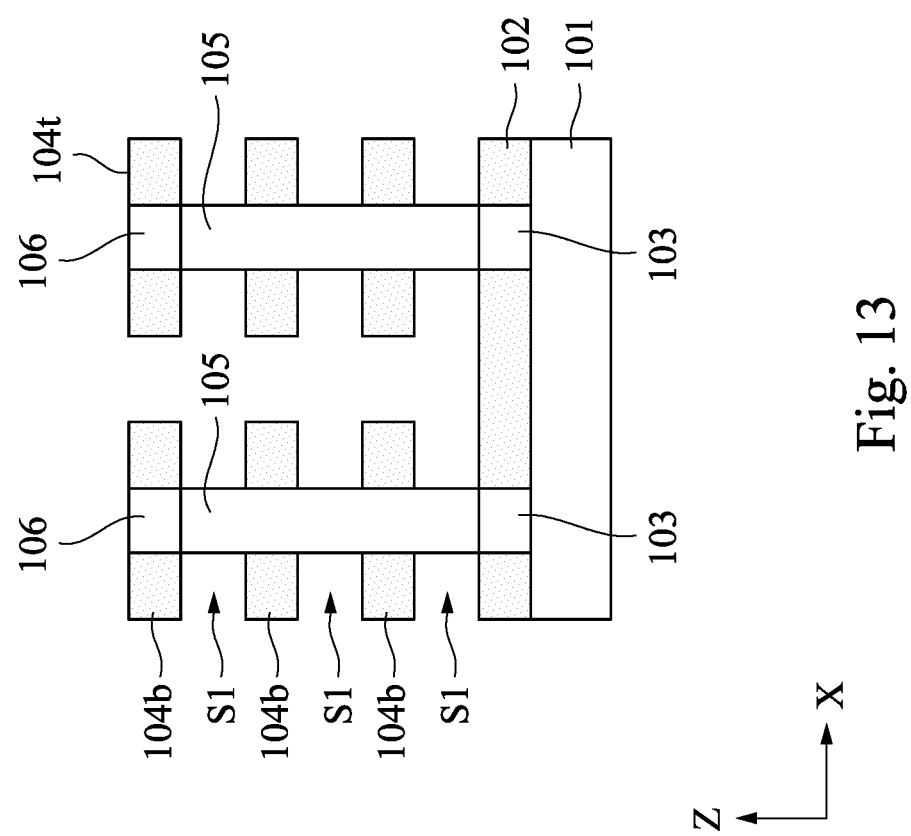

Reference is made to FIG. 13. The sacrificial layers 104a are removed by using an enchant (e.g., phosphoric acid ($H_3PO_4$) solution) through the through opening O3 to expose portions of the channel layer 105. Therefore, spaces S1 are formed to inherit the shapes of the sacrificial layers 104a (see FIG. 12).

Reference is made to FIGS. 14A and 14B. An interfacial layer 107, a ferroelectric layer 108, a barrier layer 109, and a gate layer 110 are formed in the spaces S1 through the through opening O3 in sequence. Specifically, the interfacial layer 107 can be conformally formed over the multi-layered stack 104. In some embodiments, the interfacial layer 107 can be made of a dielectric material. In some embodiments, the interfacial layer 107 may include silicon oxide ($SiO_2$), silicon nitride (SiN), silicon oxynitride (SiON), silicate, combinations thereof, or other suitable materials. The interfacial layer 107 can serve as a buffer or interface between the multi-layered stack 104 and the ferroelectric layer 108. The interfacial layer 107 can help to reduce potential unwanted chemical reactions or diffusion between layers, enhancing the overall performance of the memory cell array structure 100.

The ferroelectric layer 108 can be conformally formed over the interfacial layer 107. In some embodiments, the ferroelectric layer 108 may include ferroelectric material, such as silicon-doped hafnium oxide ($HfO_2$), aluminum-doped ($HfO_2$), hafnium zirconium oxide ($HfZrO_x$), hafnium oxide ($HfO_2$), or zirconium oxide ($ZrO_2$), combinations thereof, or other suitable materials. The ferroelectric layer 108 can exhibit ferroelectric properties in the memory cell array structure 100. This ferroelectric layer 108 can retain polarization (electric dipole orientation) even after the electric field is removed. Therefore, the data storage in the memory cell array structure 100 can represented by the two possible polarization states of the ferroelectric layer 108, corresponding to binary "0" and "1".

The barrier layer 109 can be conformally formed over the ferroelectric layer 108. In some embodiments, the barrier layer 109 may include tantalum nitride (TaN), titanium, titanium nitride (TIN), combinations thereof, or other suitable materials. The barrier layer 109 may protect the ferroelectric layer 108 and prevent unwanted chemical interactions or material diffusion between the ferroelectric layer 108 and the gate layer 110.

Subsequently, an annealing process can be performed on the ferroelectric layer 108 to crystallize the as-deposited ferroelectric layer 108. Specifically, ferroelectric characteristics of the ferroelectric layer 108 originate from the alignment of electric dipoles within a crystal lattice structure of the material. When an electric field is applied, these dipoles can align in a particular direction, creating a polarization state that remains even when the electric field is removed. This provides the non-volatile memory characteristic to the FeTFET 120. However, the ferroelectric materials may tend to be amorphous when they are initially deposited, meaning the atoms are randomly distributed rather than being ordered in a crystal lattice. Therefore, the annealing process can heat the ferroelectric layer 108 to a specific temperature for a certain amount of time and then slowly cooling it down. This annealing process may allow the atoms in the ferroelectric layer 108 to rearrange themselves into a crystalline structure and facilitates the formation of a crystalline phase that exhibits the desired ferroelectric properties.

Subsequently, a gate layer 110 can be deposited over the barrier layer 109 and filled in the through opening O3. In some embodiments, the gate layer 110 may include poly-silicon, metal or other suitable conductive material. In some embodiments, the gate layers 110 may include tungsten (W), cobalt (Co), ruthenium (Ru), molybdenum (Mo), aluminum (Al), copper (Cu), combinations thereof, or other suitable materials. The gate layer 110 can act as a control terminal of the FeTFET 120. By applying different voltages to the gate layer 110, it can influence the polarization state of the ferroelectric layer 108, effectively writing (programming), erasing, or reading the state of the memory cell in the memory cell array structure 100 (see FIGS. 1A-4D).

As a result, the FeTFETs 120 can be defined at intersections between the interfacial layer 107, the ferroelectric layer 108, the barrier layer 109, the gate layer 110, and the channel layer 105, so as to form a memory cell array structure 100. In some embodiments, the FeTFETs 120 are fundamentally similar to the FeTFETs shown in FIGS. 1A-3B. That means the FeTFETs 120 can correspond to the FeTFETs in the previous figures. In some embodiments, the FeTFETs 120 can be interchangeably referred to memory cells.

Figure 15:
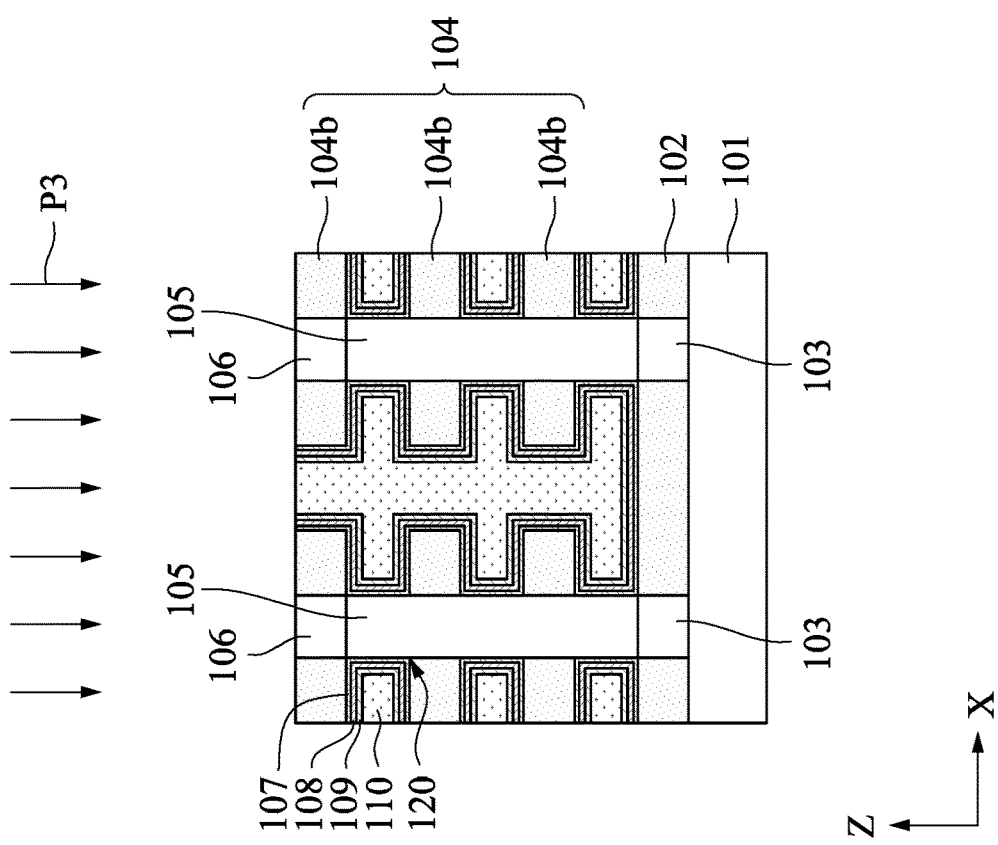

Reference is made to FIG. 15. a planarization process P4 (e.g., CMP) is performed to remove the excessive interfacial layer 107, ferroelectric layer 108, barrier layer 109, and gate layer 110 above the top surface 104t of the multi-layered stack 104.

Figure 16:
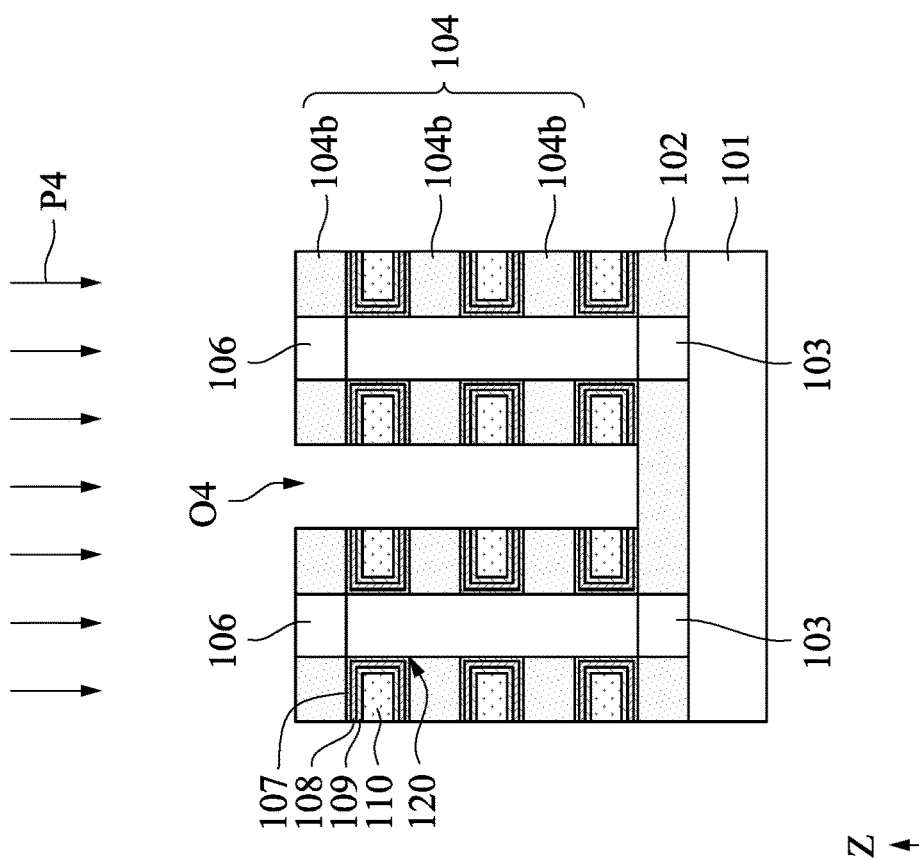

Reference is made to FIG. 16. An etching process P5 is performed to form a through opening O4 passing through the multi-layered stack 104 along the Z-direction and terminating at the top surface 102t of the dielectric layer 102. In some embodiments, the etching process P5 can be an anisotropic etching process, such as a reactive ion etching (RIE) process, performed on the multi-layered stack 104 using a patterned hard mask layer (not shown) as an etching mask.

Figure 17:
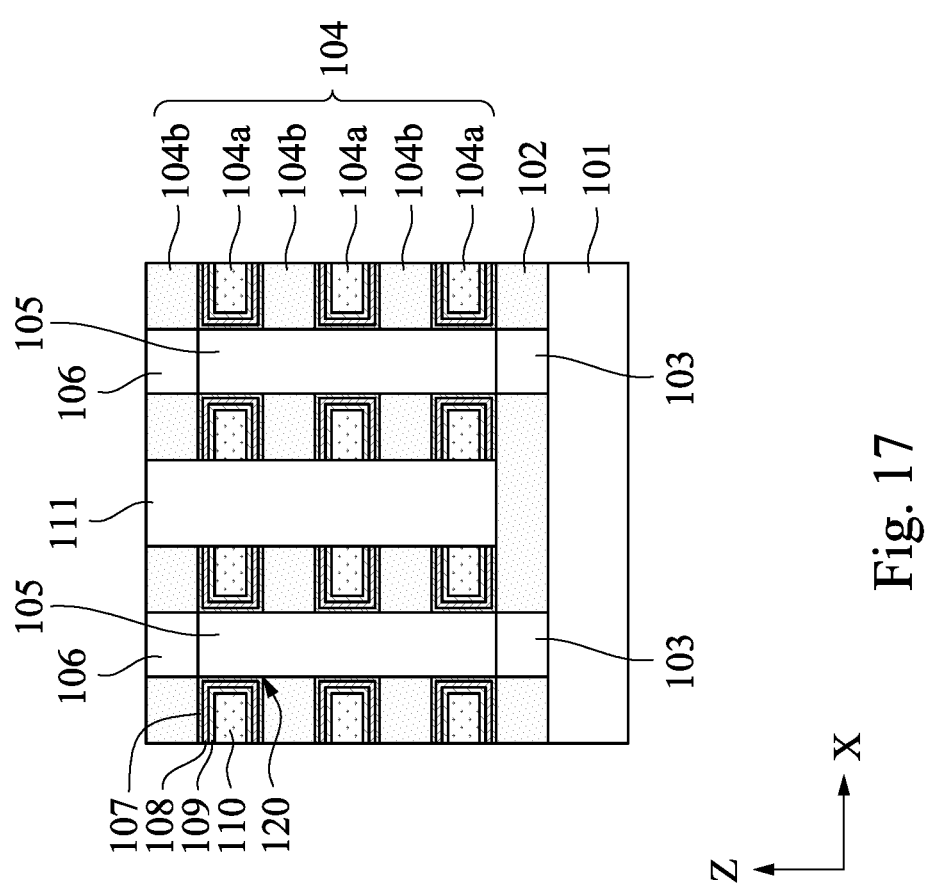

Reference is made to FIG. 17. A dielectric material 111 is deposited over the multi-layered stack 104 and fills in the through opening O4. In some embodiments, the dielectric material 111 may be made of, such as silicon dioxide ($SiO_2$). In some embodiments, the dielectric material 111 may be made of a same material as the insulating layers 104b. In some embodiments, the dielectric material 111 may be made of a different material than the insulating layers 104b. Subsequently, a planarization process is performed to remove the excessive dielectric material 111 above the top surface 104t of the multi-layered stack 104.

In some embodiment, located beneath the bottommost gate layer 110, a gate layer connected to a ground select line can be formed to reside. This layer can serve as a reference or ground potential, ensuring a stable baseline voltage across the memory cell array structure. Above the topmost gate layer 110, a gate layer connected to the SSL can be formed. This layer can function as a control terminal for the topmost memory cells in each memory string, facilitating their selection during read, write, and erase operations. Above this entire structure, bit lines and other related structures can be formed. The bit lines serve as the data pathways, transporting information in and out of the memory cell array structure 100.

Although the present invention has been described in considerable detail with reference to certain embodiments thereof, other embodiments are possible. Therefore, the spirit and scope of the appended claims should not be limited to the description of the embodiments contained herein. The present disclosure in various embodiments provides a ferroelectric tunneling field-effect transistor (FeTFET). The FeTFET can eliminate of the need for channel doping, and thus the floating body of the FeTFET can be programmed and erased in efficiency, and the manufacturing complexities can be reduced accordingly. Additionally, the source and drain regions of the FeTFET are doped with dopants of different conductivities, (i.e., n-type dopant (n+) and p-type dopant (p+)). This arrangement can offer enhanced control over charge carrier movement, improving the transistor's overall functionality on the memory cell array structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An integrated circuit (IC) structure, comprising:
a substrate; and
a memory cell over the substrate, the memory cell comprising:
a channel layer;
a first doped region at a first side of the channel layer, the first doped region doped with a first dopant being of a first conductivity type;
a second doped region at a second side of the channel layer opposing the first side, the second doped region doped with a second dopant being of a second conductivity type different from the first conductivity type;
a first ferroelectric layer over the channel layer and between the first and second doped regions;
a second ferroelectric layer over the channel layer and spaced apart from the first ferroelectric layer by a non-zero distance;
a first gate layer over the first ferroelectric layer; and
a second gate layer over the second ferroelectric layer.

2. The IC structure of claim 1, wherein the channel layer has a dopant concentration less than 1E11 $cm^{-3}$.

3. The IC structure of claim 1, wherein the channel layer extends from the first doped region to the second doped region in a direction in parallel with a top surface of the substrate.

4. The IC structure of claim 1, wherein the channel layer extends from the first doped region to the second doped region in a direction perpendicular to a top surface of the substrate.

5. The IC structure of claim 1, wherein the first dopant being of a p-type dopant, and the second dopant being of an n-type dopant.

6. The IC structure of claim 1, wherein the first ferroelectric layer is made of silicon-doped hafnium oxide, aluminum-doped, hafnium zirconium oxide, hafnium oxide, or zirconium oxide, combinations thereof, or combinations thereof.

7. The IC structure of claim 1, further comprising:
a word line connected to the first gate layer.

8. A method for forming an integrated circuit structure, comprising:
forming a first doped semiconductive layer over a substrate, the first doped semiconductive layer comprising a first dopant with a first conductivity type;
forming a multi-layered stack over the first doped semiconductive layer, the multi-layered stack comprising a plurality of insulating layers stacked in a vertical direction and spaced apart from each other;
forming a channel layer vertically extending through the multi-layered stack and on the first doped semiconductive layer;
forming a second doped semiconductive layer over the channel layer, the second doped semiconductive layer comprising a second dopant with a second conductivity type different from the first conductivity type;
forming a plurality of ferroelectric layers alternately stacked with the insulating layers and over the channel layer; and
forming a plurality of gate layers over the ferroelectric layers.

9. The method of claim 8, wherein the channel layer is made of un-doped silicon.

10. The method of claim 8, wherein the first dopant is of a p-type dopant, and the second dopant is of an n-type dopant.

11. The method of claim 8, wherein the gate layers comprise tungsten.

12. The method of claim 8, further comprising:
prior to forming the ferroelectric layers, forming a plurality of interfacial dielectric layers alternately stacked with the insulating layers and over the channel layer.

13. The method of claim 8, further comprising:
prior to forming the gate layers, forming a plurality of barrier layers over the ferroelectric layers.

14. The method of claim 13, wherein the barrier layers comprise titanium nitride.

15. A method for operating an integrated circuit structure, the integrated circuit structure comprising a memory cell array structure that comprises a plurality of ferroelectric tunnel field-effect transistors (FeTFETs) configured as memory cells in a grid-like structure defined by integrated a plurality of laterally gate layers and a plurality of vertically channel layers, the laterally gate layers arranged in a vertical direction and each connected to distinct word lines, and the vertically channel layers arranged in a horizontal direction, sequentially connected to bit lines at their topmost ends via first doped regions, and at their bottommost ends to a sensing circuitry via second doped regions, the second doped regions being of a conductivity type different from a conductivity type of the first doped regions, the method comprising:
performing a program operation on the memory cell array structure;
performing an erase operation on the memory cell array structure; and
performing a read operation on the memory cell array structure.

16. The method of claim 15, wherein the program operation comprises:
providing a voltage to one of the word lines to generate an electric field that instigates a shift in a polarization of a ferroelectric layer within one of the FeTFETs;
maintaining the other word lines at zero voltage;
grounding one of the bit lines; and
providing the voltage to the other bit lines.

17. The method of claim 15, wherein the erase operation comprises:
providing a voltage to the word lines to facilitate a reversal of polarization in a ferroelectric layer within one of the FeTFETs; and
grounding the bit lines.

18. The method of claim 15, wherein the read operation comprises:
providing a first voltage to one of the word lines;
modulating the first voltage lying between a program threshold voltage and an erase threshold voltage;
providing a second voltage to the other word lines, the second voltage enabling the sensing circuitry to detect a memory state;
providing a third voltage to one of the bit lines; and
grounding the other bit lines.

19. The method of claim 18, wherein the third voltage is 0.7V.

* * * * *